(12) United States Patent
Youn

(10) Patent No.: US 7,872,915 B2
(45) Date of Patent: Jan. 18, 2011

(54) NONVOLATILE MEMORY DEVICE AND READING METHOD THEREOF

(75) Inventor: Tae-Un Youn, Ichon-shi (KR)

(73) Assignee: Hynix Semiconductor Inc., Ichon-Shi, Kyoungki-Do (KR)

( * ) Notice: Subject to any disclaimer, the term of this patent is extended or adjusted under 35 U.S.C. 154(b) by 337 days.

(21) Appl. No.: 12/106,381

(22) Filed: Apr. 21, 2008

(65) Prior Publication Data

US 2009/0116285 A1    May 7, 2009

(30) Foreign Application Priority Data

Nov. 1, 2007    (KR)    ............... 10-2007-0111199

(51) Int. Cl.
G11C 11/34    (2006.01)
G11C 16/04    (2006.01)

(52) U.S. Cl. .................... 365/185.13; 365/185.12

(58) Field of Classification Search ............ 365/185.13, 365/185.12, 185.18
See application file for complete search history.

(56) References Cited

U.S. PATENT DOCUMENTS 5,969,990 A * 10/1999 Arase ................ 365/185.25
6,678,191 B2 * 1/2004 Lee et al. ................ 365/185.33

FOREIGN PATENT DOCUMENTS

| KR | 1998-061435 | 10/1998 |
| KR | 1998-066563 | 10/1998 |
| KR | 10-2005-0081391 | 8/2005 |
| KR | 10-2005-0092199 | 9/2005 |

OTHER PUBLICATIONS

Notice of Allowance for Korean Application No. 10-2007-0111199.

* cited by examiner

Primary Examiner—Anh Phung
(74) Attorney, Agent, or Firm—Lowe Hauptman Ham & Berner LLP

(57) ABSTRACT

A nonvolatile memory device can improve its operation characteristic by reducing leakage current of a bit line in a read operation. The nonvolatile memory device includes a plurality of word lines, a plurality of main bit lines intersecting with the plurality of word lines, a plurality of cell blocks each including a plurality of cell strings, each of the cell strings including first and second select transistors and a plurality of memory cells, a plurality of sub bit lines commonly connected to the respective cell strings in same group, the cell blocks being grouped into a plurality of groups whose number is identical to or smaller than the number of the cell blocks, a plurality of group selectors configured to selectively connect the main bit lines to the sub bit lines of a selected group, and a plurality of page buffers configured to sense data of the memory cells through the main bit lines.

16 Claims, 7 Drawing Sheets

NONVOLATILE MEMORY DEVICE AND READING METHOD THEREOF

CROSS-REFERENCE(S) TO RELATED APPLICATIONS

The present invention claims priority of Korean patent application number 10-2007-0111199, filed on Nov. 1, 2007, which is incorporated by reference in its entirety.

BACKGROUND OF THE INVENTION

The present invention relates to semiconductor design technology, and more particularly to a nonvolatile memory device and a reading method thereof.

A NAND type flash memory device is one of nonvolatile memory devices. The NAND type flash memory device includes a plurality of unit strings, each having a plurality of cells connected in series for the high degree of integration. The NAND type flash memory is used in various fields, for example, memory sticks, universal serial bus (USB) drivers, and hard disks.

FIG. 1 a block diagram of a conventional NAND type flash memory device. FIG. 2 is a schematic circuit diagram of blocks BLK0 to BLK4095 illustrated in FIG. 1. FIG. 3 is a sectional view of blocks BLK0 to BLK4095 connected to a bit line BL0 illustrated in FIG. 2.

Referring to FIGS. 1 to 3, the conventional NAND type flash memory includes a plurality of bit lines BL0 to BLn, a plurality of word lines WL0 to WL31, and a memory cell array 100 comprising a plurality of strings. The bit lines BL0 to BLn are intersected with the word lines WL0 to WL31. Each of the strings includes a plurality of memory cells MC0 to MC31, a drain select transistor DST, and a source select transistor SST. The drain select transistor DST and the source select transistor SST are connected in series to the memory cells MC0 and MC31, respectively, to select the string. The drain select transistor DST is selected by a drain select line DSL, and the source select transistor SST is selected by a source select line SSL. Additionally, sources of the source select transistors SST in the respective strings are connected to a common source line CSL.

The NAND type flash memory device performs read and program operations on a page basis, and performs an erase operation on a block basis. Here, one page includes memory cells which have control gates commonly connected to one word line. A plurality of pages form a cell block and in each of the cell blocks BLK0 to BLK4095, one or a plurality of cell strings are connected to each bit line. Substantially, electron transition between a floating gate and a channel of a memory cell only occurs in a program operation and an erase operation. After the program and erase operations are completed, a read operation is performed just to read data from a memory cell without data loss.

In the read operation, a voltage applied to a control gate of an unselected memory cell is higher than a voltage applied to a control gate of a selected memory cell. A current may or may not flow through a corresponding bit line according to a threshold voltage of the selected memory cell. Under a predetermined voltage condition, when a threshold voltage of a programmed memory cell is higher than a reference voltage, the memory cell is read as an off-cell and a high level voltage is charged on a corresponding bit line. On the other hand, when a threshold voltage of a programmed memory cell is lower than a reference voltage, the memory cell is read as an on-cell and a corresponding bit line is discharged to a low potential level. The potential level on the bit line is finally read as '0' or '1' through a sense amplifier, called a page buffer 110.

In the conventional NAND type flash memory device, however, a plurality of cell blocks BLK0 to BLK4095 are allocated to one page buffer 110. In this case, a total number of cell strings connected to one bit line is 4096, and a total number of drain select contact plugs DCT connected to drains of the drain select transistors DST is 2048.

In general, most of a leakage current flowing through a bit line occurs in a path between the drain select contact plug DCT and the drain select transistor DST. In the case that 2048 drain select contact plugs DCT exist in one bit line, a total leakage current of the bit line increases accordingly. Therefore, in the page-based read operation, a leakage current due to the drain select contact plug DCT of the unselected memory cell block can greatly affect a corresponding bit line. Consequently, the bit line may be maintained in a discharged state due to the leakage current and a programmed cell may be determined as an erased cell.

SUMMARY OF THE INVENTION

The present invention are directed to providing a nonvolatile memory device having a memory cell array, which can improve its operation characteristic by reducing leakage current of a bit line in a read operation, and a reading method of the nonvolatile memory device.

In accordance with an aspect of the present invention, there is provided a nonvolatile memory device, which includes a plurality of word lines, a plurality of main bit lines intersecting with the plurality of word lines, a plurality of cell blocks each including a plurality of cell strings, each of the cell strings including a first select transistor, a second select transistor, and a plurality of memory cells, the memory cells being selected by the respective word lines, a plurality of sub bit lines commonly connected to the respective cell strings in the same group, the cell blocks being grouped into a plurality of groups whose number is identical to or smaller than the number of the cell blocks, a plurality of group selectors configured to selectively connect the main bit lines to the sub bit line of a selected group, and a plurality of page buffers configured to sense data of the memory cells through the main bit lines.

In accordance with an aspect of the present invention, there is provided a reading method of the nonvolatile memory device having a plurality of cell blocks each provided with a plurality of cell strings, the cell blocks being grouped into a plurality of groups, each group having a set of sub bit lines allocated to the cell strings of the cell blocks in the same group, the method including electrically connecting a main bit line to one of sub bit lines connected to the cell string having a memory cell to be read among the memory cells, and electrically separating the remaining sub bit lines from the main bit line, whereby data is read from the cell string electrically connected to the main bit line.

DESCRIPTION OF SPECIFIC EMBODIMENTS

Figure 1:
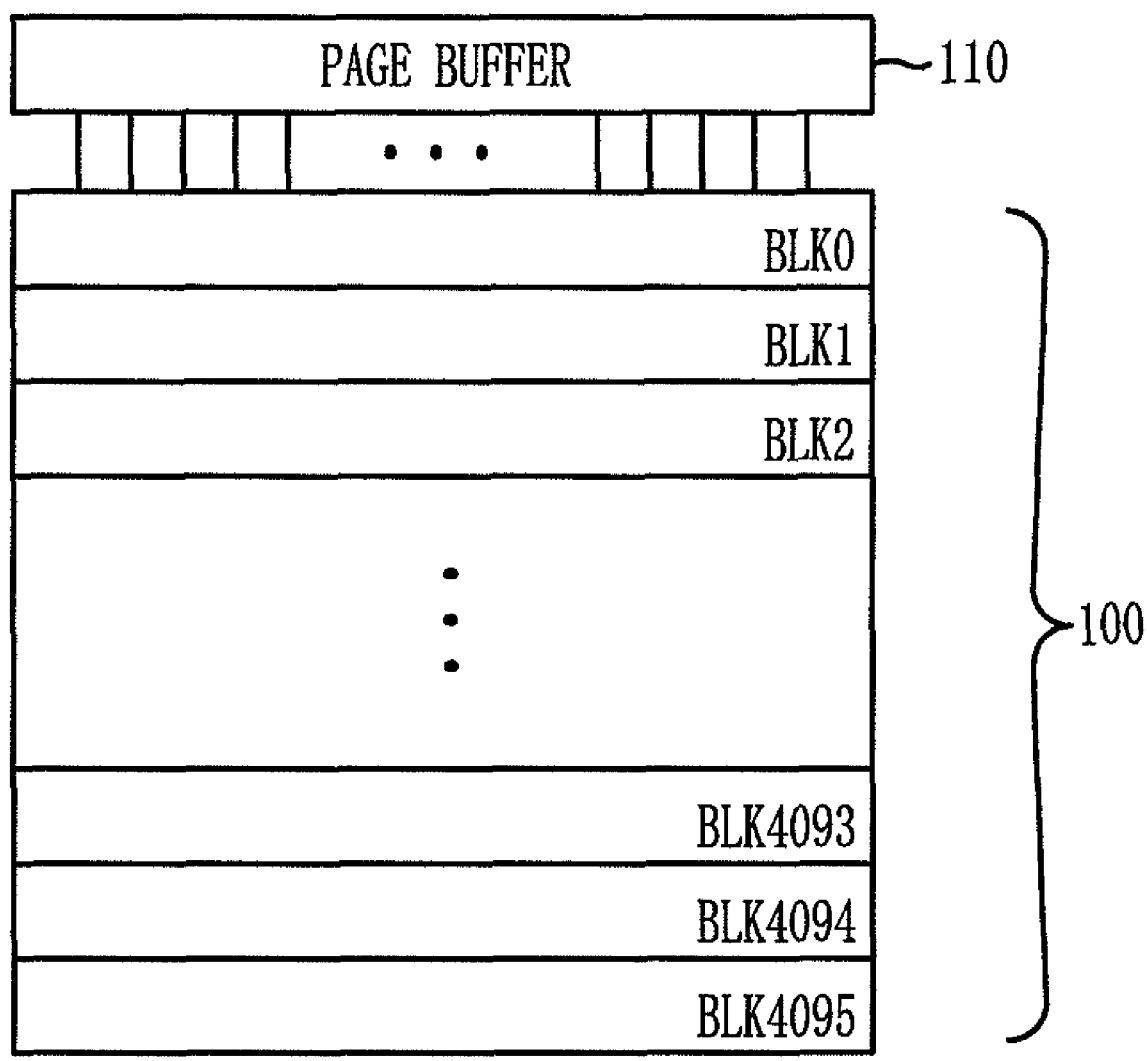
FIG. 1 a block diagram of a conventional NAND type flash memory device.
Figure 2:
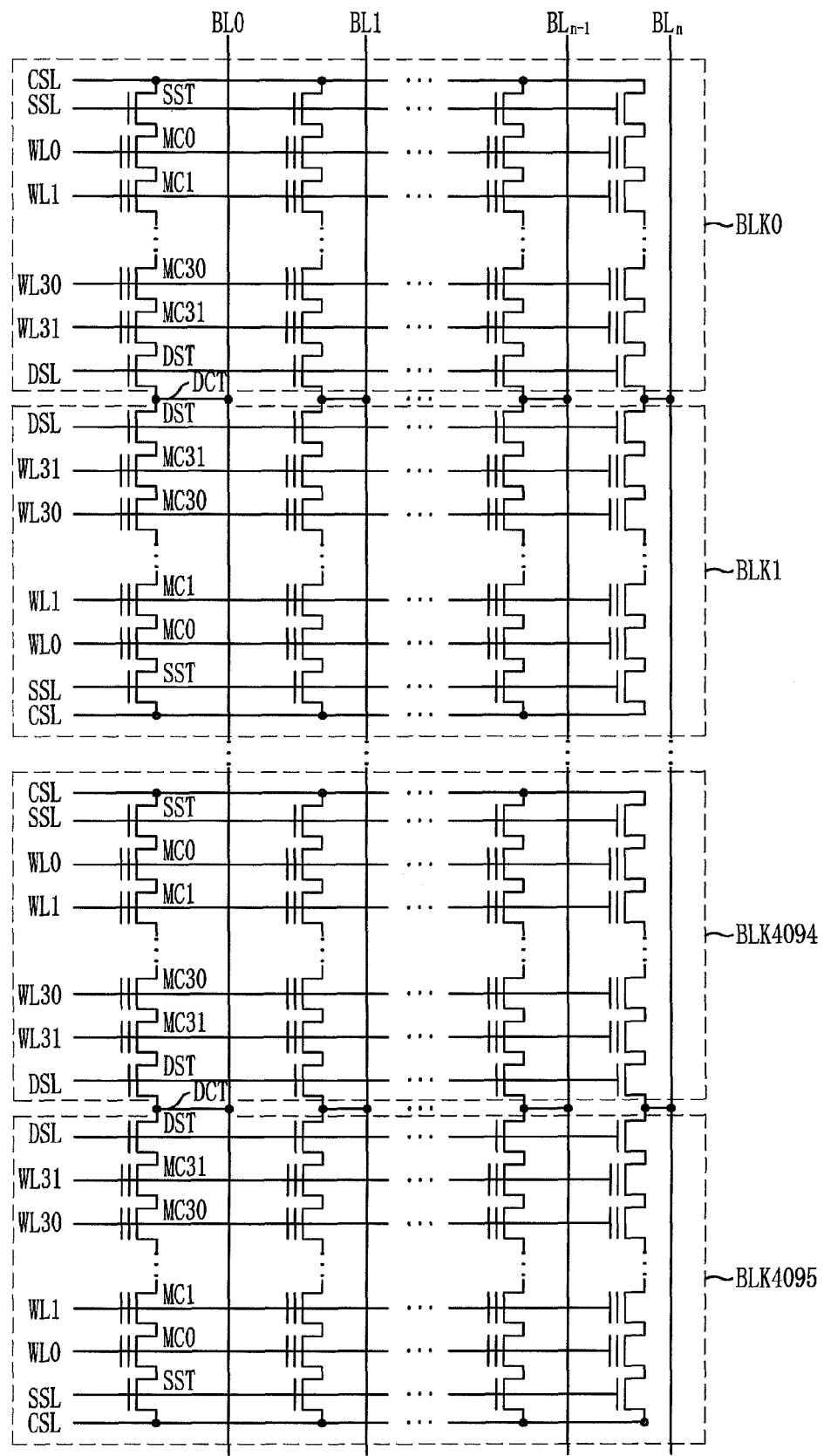
FIG. 2 is a schematic circuit diagram of blocks (BLK0 to BLK4095) illustrated in FIG. 1.
Figure 3:
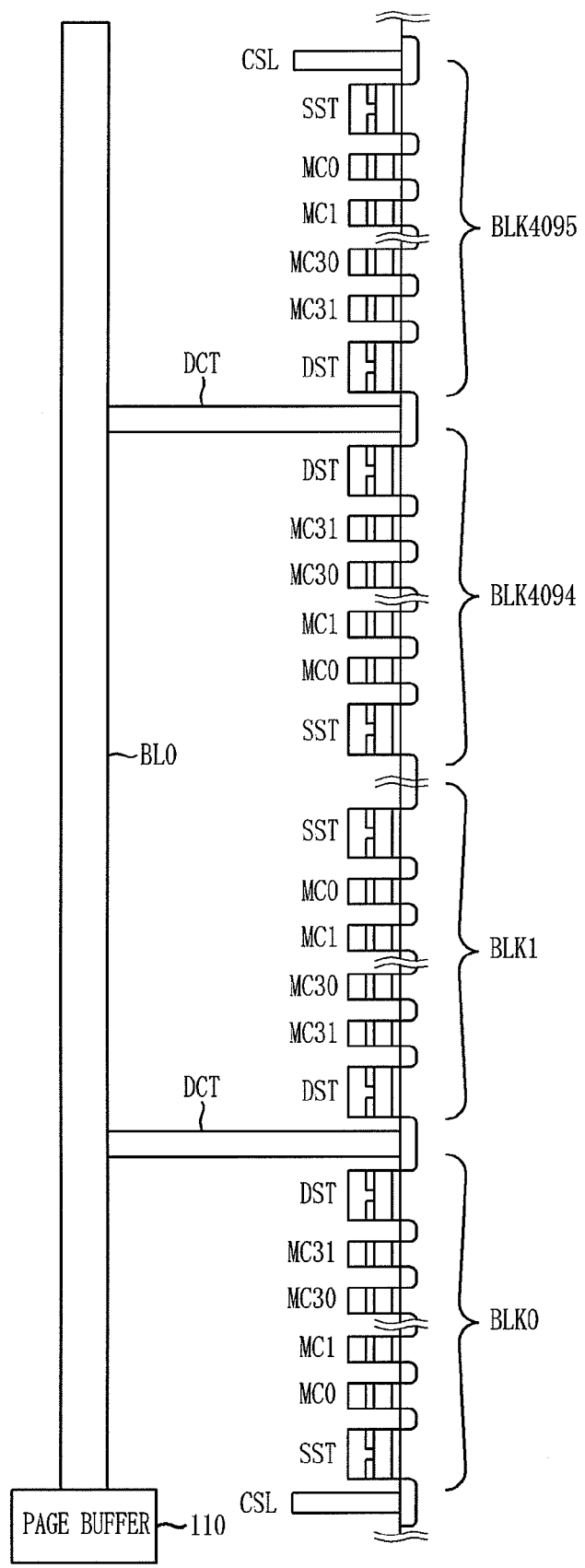
FIG. 3 is a sectional view of blocks (BLK0 to BLK4095) connected to a bit line (BL0) illustrated FIG. 2.

Hereinafter, a nonvolatile memory device and a reading method of the nonvolatile memory device in accordance with the present invention will be described in detail with reference to the accompanying drawings. Like reference numerals in the drawings denote like elements.

Figure 4:
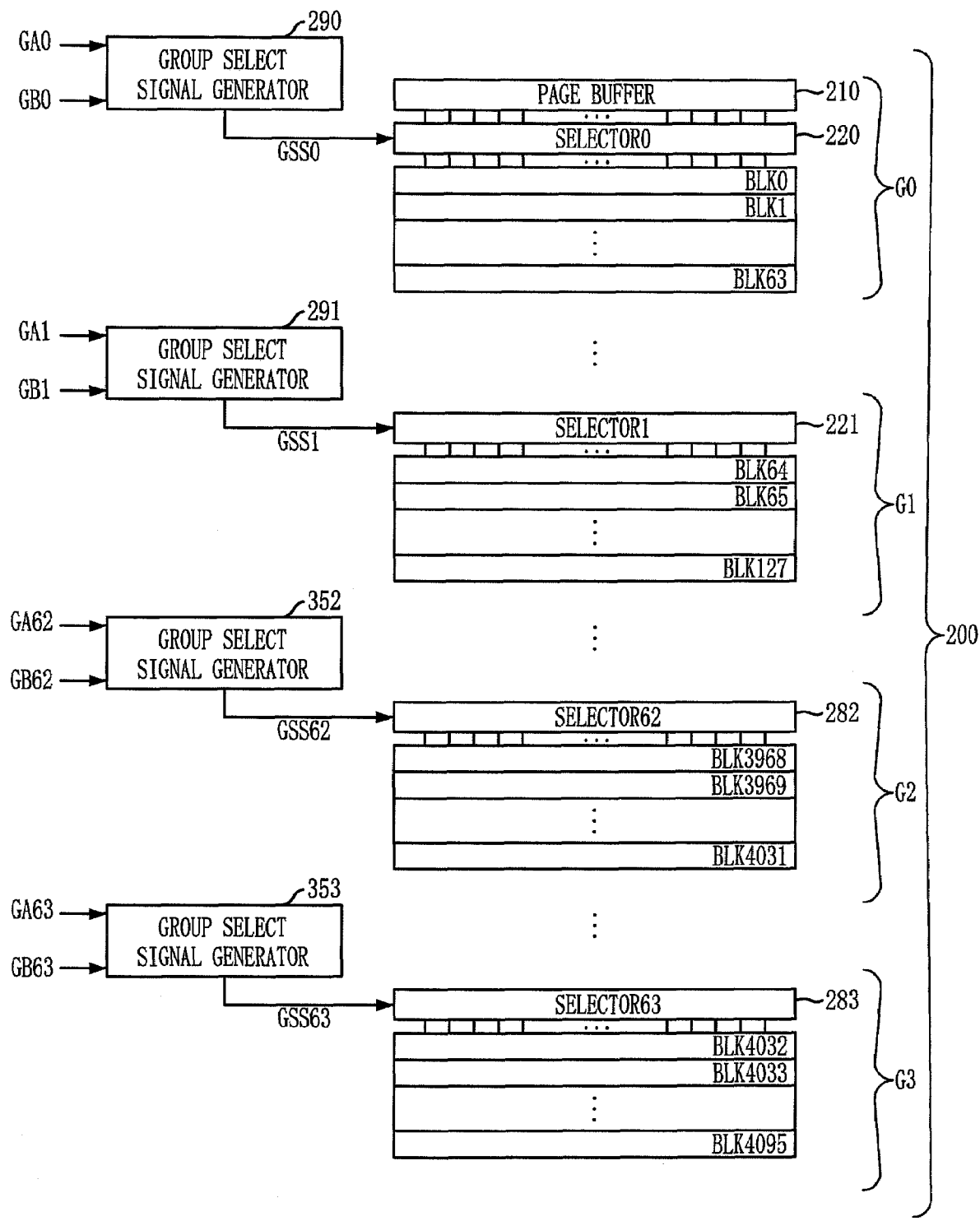
FIG. 4 is a block diagram of a NAND type flash memory device in accordance with an embodiment of the present invention.
Figure 5A:
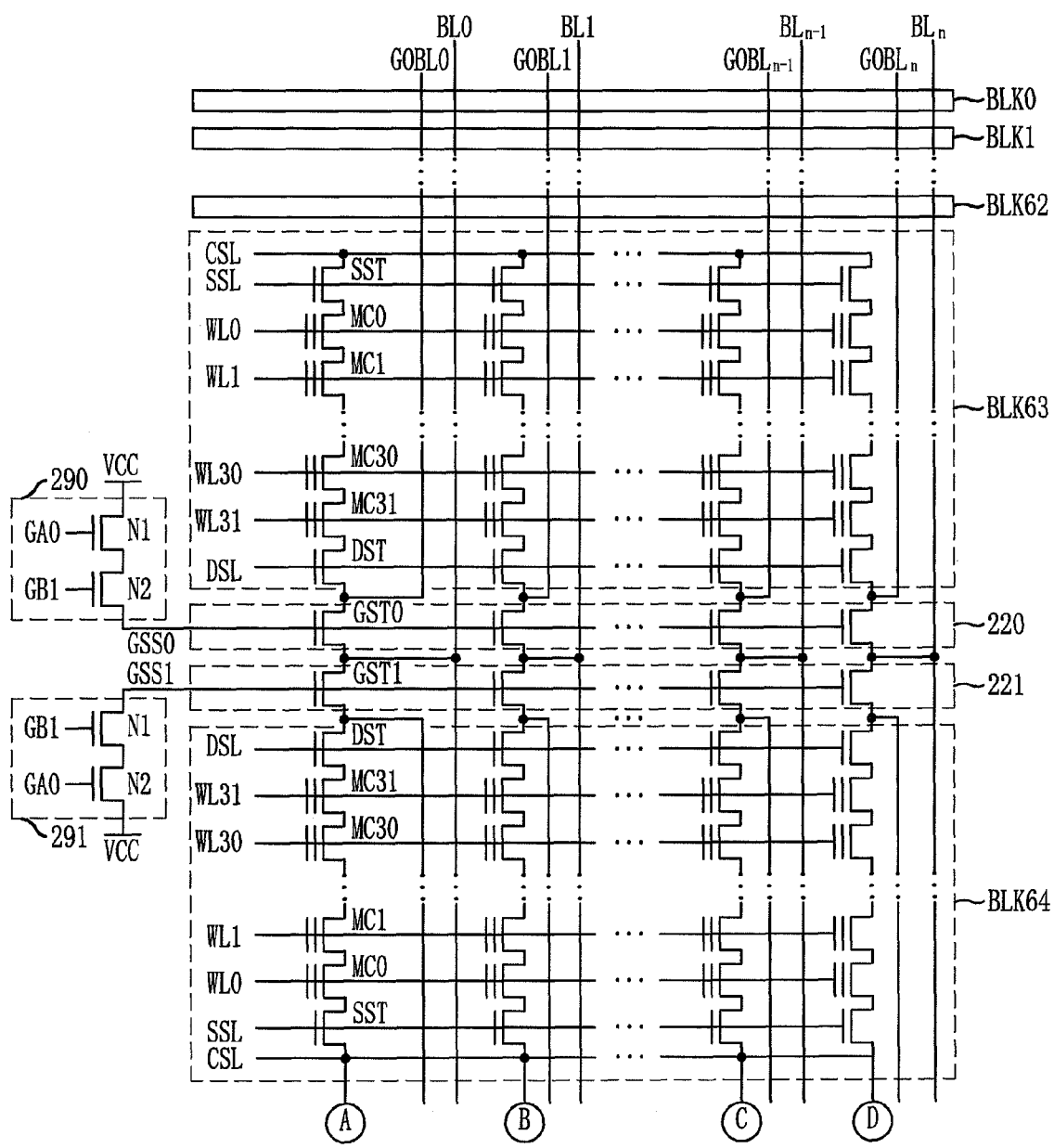
FIGS. 5A and 5B are schematic circuit diagrams of blocks (BLK0 to BLK4095) illustrated in FIG. 4.
Figure 5B:
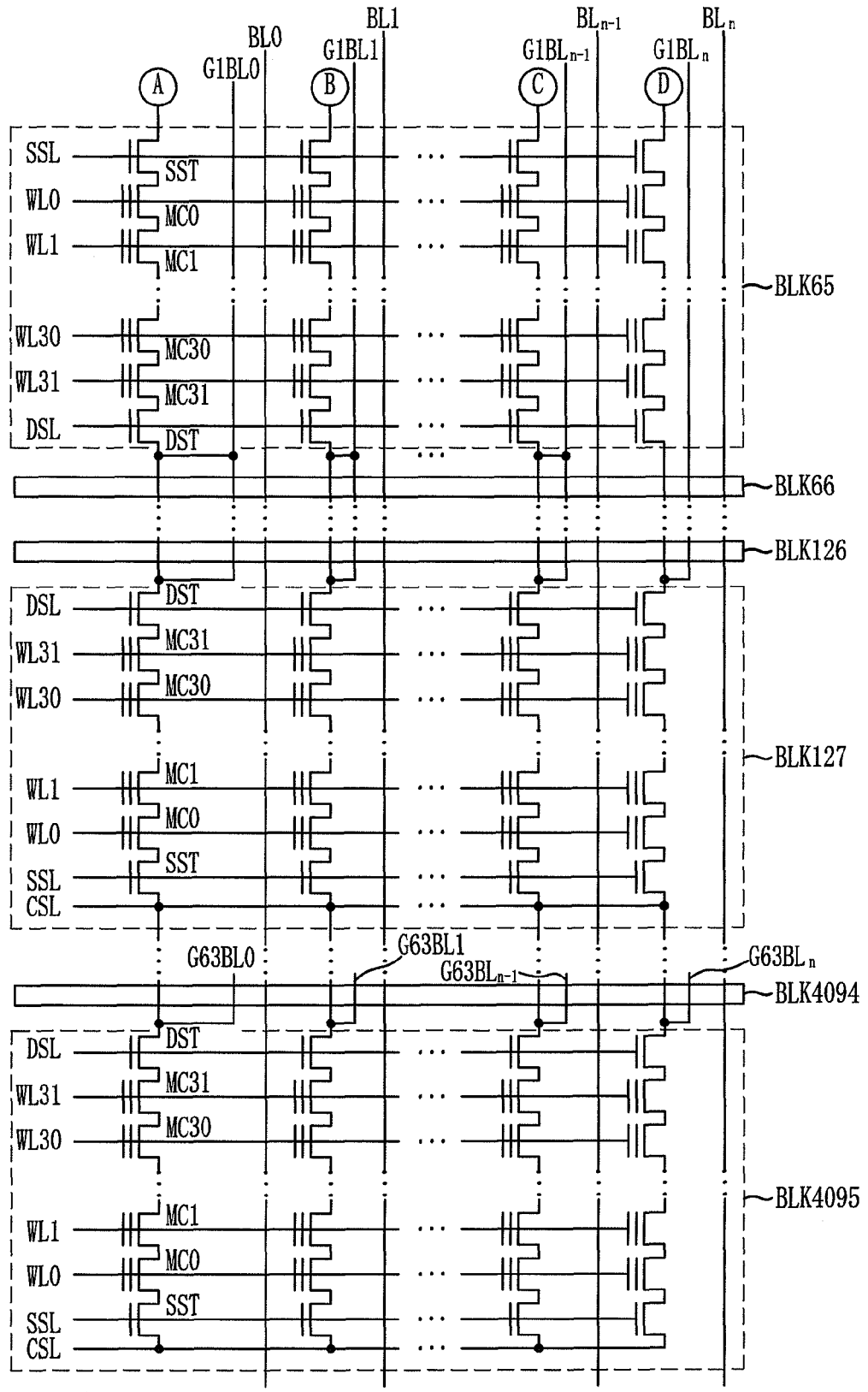
Figure 6:
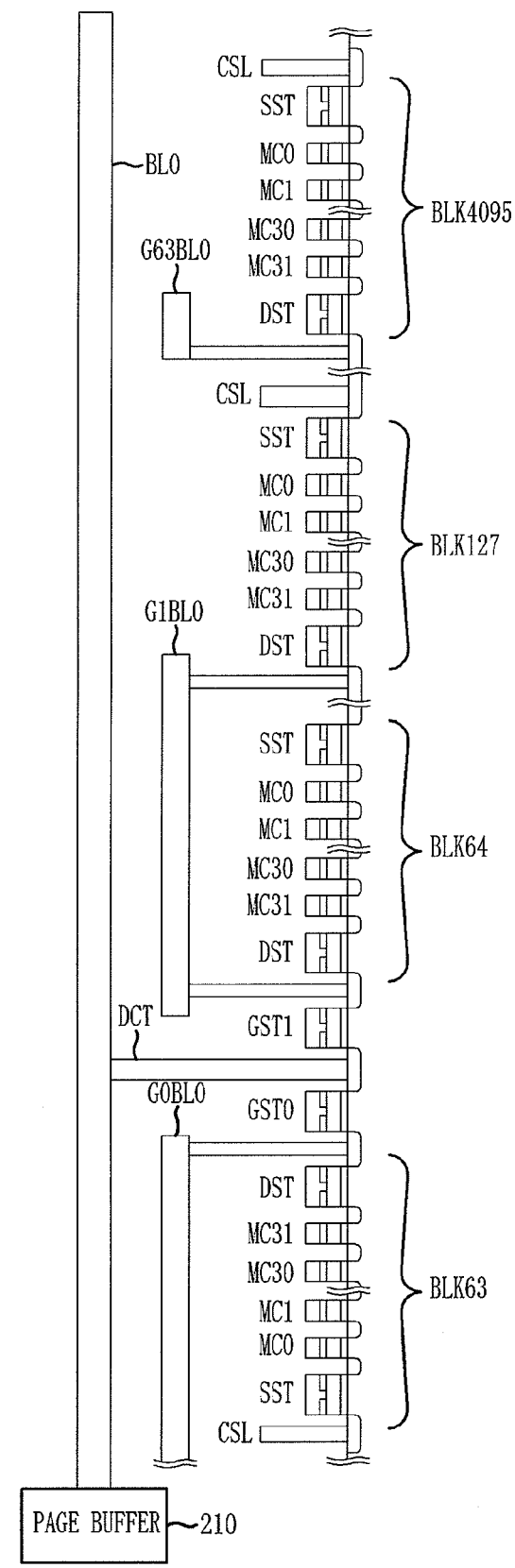
FIG. 6 is a sectional view of blocks (BLK0 to BLK4095) connected to a bit line (BL0) illustrated FIGS. 5A and 5B.

FIG. 4 is a block diagram of a NAND type flash memory device in accordance with an embodiment of the present invention. FIGS. 5A and 5B are schematic circuit diagrams of blocks BLK0 to BLK4095 illustrated in FIG. 4. FIG. 6 is a sectional view of blocks BLK0 to BLK4095 connected to a bit line BL0 illustrated in FIGS. 5A and 5B.

Referring to FIGS. 4 to 6, a memory cell array 200 of the NAND type flash memory device is divided by sixty-four (64), based on cell blocks BLK0 to BLK4095. Therefore, the memory cell array 200 is partitioned into sixty-four (64) groups G0 to G63. The sixty-four (64) partitions are merely exemplary and the number of the partitions is not limited to this example. The number of the partitions is determined within a range where a total of bit line leakage current does not influence a read operation.

Hereinafter, more specific description will be made focusing on a main bit line BL0.

For example, sub bit lines G0BL0 to G63BL0 are respectively allocated to the groups G0 to G63. According to operations of sixty-four group selectors 220 to 283, the sub bit lines G0BL0 to G63BL0 are selectively connected to the main bit line BL0 which is electrically connected to a page buffer 210.

The sub bit lines G0BL0 to G63BL0 are connected to drains of drain select transistors DST of a corresponding group through each contact plug (not shown). For example, the sub bit line G0BL0 is connected to drains of drain select transistors DST provided in the blocks BLK0 to BLK63 (i.e., group G0).

Moreover, the sub bit lines G0BL0 to G63BL0 and the main bit lines BL0 are formed by different layers so that the sub bit lines G0BL0 to G63BL0 are electrically isolated from the main bit line BL0 by an interlayer insulating layer (not shown). For example, the sub bit lines G0BL0 to G63BL0 are formed below the main bit line BL0. Also, the sub bit lines G0BL0 to G63BL0 extend in parallel to the main bit line BL0.

The group selectors 220 to 283 are respectively allocated to the groups G0 to G63. The group selectors 220 to 283 may be disposed between the groups G0 to G63, and they mutually connect the main bit line BL0 to the sub bit lines G0BL0 to G63BL0 in response to group select signals GSS0 to GSS63. Additionally, like the drain select transistor DST, the group selectors 220 to 283 may be implemented with NMOS transistors GST0 to GST63. For example, the group selectors 220 and 221 are disposed between the last block BLK63 of the group G0 and the first block BLK64 of the group G1. More specifically, the group selectors 220 and 221 are disposed between the drain select transistors DST of the block BLK63 and the drain select transistors DST of the block BLK64.

The group select lines, where the group select signals GSS0 to GSS63 are input, are formed in parallel to the word lines WL0 to WLL31 of the same layer as the word lines. Here, being formed of the same layer refers to being formed on the same plane.

The group select signals GSS0 to GSS63 can be generated using block select signals GA0 to GA63 and GB0 to GB63. Only one of the group select signals GSS0 to GSS63 is enabled to logic high ("1") in the read operation of the NAND type flash memory device.

For example, as illustrated in FIGS. 4, 5A and 5B, sixty-four (64) group select signal generators 290 to 353 generate the group select signals GSS0 to GSS63 in response to the block select signals GA0 to GA63 and GB0 to GB63. In each of the group select signal generators 290 to 353, two NMOS transistors N1 and N2 are connected in series and receive one of the block select signals GA0 to GA63 and one of the block select signals GB0 to GB63. Although not illustrated, the two NMOS transistors are connected in series between a power supply voltage terminal and a ground voltage terminal to output one of the group select signals GSS0 to GSS63 between them. In this case, the group select signals GSS0 to GSS63 have logic high ("1") of the power supply voltage or logic low ("0") of the ground voltage according to the operation of the two NMOS transistors.

Hereinafter, the read operation of the NAND type flash memory device will be described. Herein, the read operation on one page of the block BLK0 belonging to the group G0 will be described as one example.

First, the group select signal GSS0 of a logic high state is input. At this point, the remaining group select signals GSS1 to GSS63 are in a floating state which is not a logic high state, or a logic low state according to the circuit configuration of the group select signal generators 290 to 353.

The NMOS transistor GST0 of the group selector 220 is turned on in response to the group select signal GSS0, whereas the NMOS transistors of the other group selectors 221 to 283 are turned off. Consequently, the sub bit line G0BL0 is connected to the main bit line BL0 through the group selector 220. However, the remaining sub bit lines G1BL0 to G63BL0 are not connected to the main bit line BL0 by the group selectors 221 to 283.

Accordingly, even if leakage current occurs through the drain select contact plugs DCT of the blocks BLK0 to BLK63 connected to the sub bit line G0BL0 in the read operation, a total leakage current flowing through the main bit line BL0 is reduced to one sixty-fourth ($1/64$) compared to the conventional art. Therefore, the operation characteristic of the NAND type flash memory device can be greatly improved.

More specifically, when a selected cell is a programmed cell, a corresponding bit line is charged with a potential of 1 V and, when a selected cell is an erased cell, a corresponding bit line is discharged to a potential of 0 V. Accordingly, the programmed cell is read as '1' and the erased cell is read as '0' through the page buffer 210. Meanwhile, when the 2028 drain select contact plugs are commonly connected to each of the bit lines as in the conventional art, the total leakage current increases in a corresponding bit line, thereby reducing a potential charged in the corresponding bit line. Therefore, even through the selected cell is a programmed cell, the page buffer 210 may recognize it as logic low ("0"), i.e., an erased cell, not logic high ("1"). According to the present invention, however, the number of the drain select contact plugs DCTs allocated to the main bit line BL0 is thirty two (32), i.e., one sixty-fourth ($1/64$) of the conventional art, therefore, the total leakage current in a corresponding bit line in the read operation is reduced to one sixty-fourth ($1/64$) compared to the conventional art. Accordingly, leakage current affecting the read operation can be drastically reduced.

In accordance with the embodiments of the present invention, cell blocks having a plurality of cell strings are divided into a plurality of groups and a plurality of sub bit lines are allocated to each of the groups. The read operation is performed by selectively connecting a plurality of sub bit lines in a selected group to corresponding main bit lines, thereby allocating the selected sub bit lines to a page buffer disposed in the memory cell array. Therefore, a total leakage current flowing through a bit line in the NAND type flash memory device is reduced, thereby preventing an erroneous read operation.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
a plurality of word lines;
a plurality of main bit lines intersecting with the plurality of word lines;
a plurality of cell blocks each including a plurality of cell strings, each of the cell strings including a first select transistor, a second select transistor, and a plurality of memory cells, the memory cells being selected by the respective word lines, wherein the plurality of cell blocks are grouped into a plurality of groups and the number of groups is identical to or smaller than the number of cell blocks;
a plurality of sub bit lines, wherein each group has a set of sub bit lines commonly connected to the respective cell strings of the cell blocks in the same group;
a plurality of group selectors configured to selectively connect the main bit lines to the sub bit lines of a selected group; and
a plurality of page buffers configured to sense data of the memory cells through the main bit lines,
wherein each of the group selectors includes a third select transistor connected in series between the first select transistors in adjacent cell blocks of adjacent groups.

2. The nonvolatile memory device as recited in claim 1, wherein the group selector connects the main bit lines to the sub bit lines connected to the cell strings having memory cells to be read.

3. The nonvolatile memory device as recited in claim 1, wherein the third select transistor is an NMOS transistor.

4. The nonvolatile memory device as recited in claim 1, further including contact plugs configured to connect drains of the third select transistors to the main bit line.

5. The nonvolatile memory device as recited in claim 1, further including select lines configured to select the third select transistors.

6. The nonvolatile memory device as recited in claim 5, wherein the select lines are parallel to the word lines.

7. The nonvolatile memory device as recited in claim 5, wherein the select lines and the word lines are formed of a same layer.

8. The nonvolatile memory device as recited in claim 1, further including group select signal generators configured to generate group select signals for controlling the operation of the group selectors.

9. The nonvolatile memory device as recited in claim 8, wherein the group select signal generator includes a plurality of transistors connected in series between a power supply voltage terminal and the group selector.

10. The nonvolatile memory device as recited in claim 8, wherein the group select signal generator includes a plurality of transistors connected in series between a power supply voltage terminal and a ground voltage terminal.

11. The nonvolatile memory device as recited in claim 1, wherein the cell blocks include the same or different number of cell strings.

12. The nonvolatile memory device as recited in claim 1, wherein the main bit lines are formed of a layer different from a layer for the sub bit lines, whereby the main bit lines are electrically isolated from the sub bit lines.

13. The nonvolatile memory device as recited in claim 1, wherein the main bit lines are formed above the sub bit lines.

14. The nonvolatile memory device as recited in claim 1, wherein the sub bit lines are parallel to the main bit lines.

15. The nonvolatile memory device as recite in claim 1, further including a contact plug configured to connect the sub bit line to a drain of the first select transistor.

16. A reading method of the nonvolatile memory device having: a plurality of cell blocks each provided with a plurality of cell strings, the cell blocks being grouped into a plurality of groups so that the number of groups is identical to or smaller than the number of cell blocks in each group, and each group having a set of sub bit lines allocated to the cell strings of the cell blocks in the same group; and a plurality of group selectors configured to selectively connect the main bit lines to the sub bit lines of a selected group, the method comprising:
electrically connecting a main bit line to one of sub bit lines connected to the cell string having a memory cell to be read among the memory cells; and
electrically separating the remaining sub bit lines from the main bit line, whereby data is read from the cell string electrically connected to the main bit line,
wherein each of the group selectors includes a third select transistor connected in series between the first select transistors in adjacent cell blocks of adjacent groups.

* * * * *